United States Patent
Sandrana et al.

(10) Patent No.: US 8,450,984 B2
(45) Date of Patent: May 28, 2013

(54) DIAGNOSIS AND PROGNOSIS OF ROTOR THERMAL SENSITIVITY

(75) Inventors: Ravikumar Sandrana, Bangalore (IN); Sudhanshu Rai, Bangalore (IN)

(73) Assignee: General Electric Company, Schenectady, NY (US)

( * ) Notice: Subject to any disclaimer, the term of this patent is extended or adjusted under 35 U.S.C. 154(b) by 476 days.

(21) Appl. No.: 12/915,105

(22) Filed: Oct. 29, 2010

(65) Prior Publication Data
US 2012/0105021 A1 May 3, 2012

(51) Int. Cl.
*G05B 13/02* (2006.01)

(52) U.S. Cl.
USPC .................. 322/33; 700/28; 318/490

(58) Field of Classification Search
USPC ............. 322/33, 37; 700/28; 318/490
See application file for complete search history.

(56) References Cited

U.S. PATENT DOCUMENTS

| | | | |
|---|---|---|---|
| 4,137,780 A | 2/1979 | Wolfinger | |
| 4,453,407 A | 6/1984 | Sato et al. | |
| 5,189,350 A * | 2/1993 | Mallett | 318/434 |
| 6,046,602 A | 4/2000 | Stein | |
| 6,338,029 B1 | 1/2002 | Abbata et al. | |
| 7,539,549 B1 * | 5/2009 | Discenzo et al. | 700/28 |
| 8,405,339 B2 * | 3/2013 | Zhang et al. | 318/490 |

OTHER PUBLICATIONS

Search Report issued in connection with GB Patent Application No. 1118414.0, Feb. 16, 2012.

* cited by examiner

*Primary Examiner* — Nicholas Ponomarenko
(74) *Attorney, Agent, or Firm* — Ernest G. Cusick; Hoffman Warnick LLC (57) ABSTRACT

A system and method for diagnosis and prognosis of thermal sensitivity in a rotor of an electrical machine. A first system is provided for evaluating thermal sensitivity in a rotor of an electrical machine and includes: an input system for obtaining vibration data and field current from the rotor and for obtaining a set of operating parameter; a system for calculating a relationship between vibration and field current; an evaluation system for determining whether the relationship is significant; and a system for issuing a notification of thermal sensitivity in response to a determination of a significant relationship. A second system includes a system for calculating a series of relationships between vibration and field current over a period of time; an evaluation system for determining whether a change in the series of relationships over the period of time is significant; and a system for issuing a notification of thermal sensitivity in response to a determination of a significant change in the series of relationships.

16 Claims, 6 Drawing Sheets

DIAGNOSIS AND PROGNOSIS OF ROTOR THERMAL SENSITIVITY

BACKGROUND OF THE INVENTION

The present invention relates generally to rotor thermal sensitivity and more particularly to diagnosis and prognosis of rotor thermal sensitivity by evaluating the relationship between vibration and field current.

Generator rotor thermal sensitivity is a phenomenon that may occur on a generator rotor causing the rotor vibration to change as field current is increased. If the rotor winding is not balanced both electrically and mechanically in the radial direction, the generator rotor will be unevenly loaded which can cause the rotor to bow and cause excessive vibration. Rotor thermal sensitivity has been a persistent problem associated with generators, which limits the operation of the generator at high field currents and can lead to forced outage.

Unfortunately, it is difficult to diagnose vibrations caused by thermal sensitivity in an online manner. Instead, off-line diagnosis is typically employed and can take many hours to perform.

BRIEF DESCRIPTION OF THE INVENTION

The solutions put forth provide for online diagnosis of rotor thermal sensitivity so that corrective action can be taken at a very early stage leading to significant savings in repair cost as well as increased availability of the machines.

In one aspect of the invention, a system for evaluating thermal sensitivity in a rotor of an electrical machine is provided, comprising: an input system for obtaining vibration data and field current from the rotor, and for obtaining a set of operating parameters; a system for calculating a relationship between vibration and field current at stable operating conditions, wherein the stable operating conditions are based on the set of operating parameters; an evaluation system for determining whether the relationship is significant; and an output system for issuing a notification of thermal sensitivity in response to a determination of a significant relationship.

In another aspect of the invention, a system for evaluating thermal sensitivity in a rotor of an electrical machine is provided, comprising: an input system for obtaining vibration data and field current from the rotor and for obtaining a set of operating parameters; a system for calculating a series of relationships between vibration and field current over a period of time at stable operating conditions, wherein the stable operating conditions are determined based on the set of operating parameters; an evaluation system for determining whether a change in the series of relationships over the period of time is significant; and an output system for issuing a notification of thermal sensitivity in response to a determination of a significant change in the series of relationships.

In a further aspect of the invention, a computer program comprising program code embodied in at least one computer-readable storage medium is provided, which when executed, enables a computer system to provide a method of evaluating thermal sensitivity in a rotor of an electrical machine, the method comprising: obtaining vibration data and field current from the rotor, and for obtaining a set of operating parameters; calculating a relationship between vibration and field current at stable operating conditions, wherein the stable operating conditions are based on the set of operating parameters; determining whether the relationship is significant; and issuing a notification of thermal sensitivity in response to a determination of a significant relationship.

DETAILED DESCRIPTION OF THE INVENTION

Various embodiments of the present invention are directed to prognosis and diagnosis of rotor thermal sensitivity. Technical effects of the various embodiments of the present invention include the ability to identify rotor thermal sensitivity online at an early stage, thus providing the capability of avoiding costly off-line diagnosis. Additional technical effects include the ability to recommend safe operating conditions when rotor thermal sensitivity is detected and to predict a time to failure.

If a rotor is thermally sensitive, rotor vibration varies as a function of field current. The relationship between vibration and field current can be measured by several statistical methods, including, e.g., rate of change in vibration with respect to field current, coefficient of determination between vibration and field current, a correlation coefficient, a transfer function, a regression model, etc. A significant relationship between vibration and field current or change in the relationship between vibration and field current over a period of time, indicates the rotor is thermally sensitive. The thresholds for significant relationship and change in relationship over a period of time are calculated statistically. If the rotor is diagnosed as thermally sensitive, a threshold field current associated with a maximum allowable vibration can be determined. The rotor can then be monitored to ensure it is operating within safe conditions by limiting the operating load, etc., thereby ensuring that the vibration is less than the threshold vibration.

Figure 1:
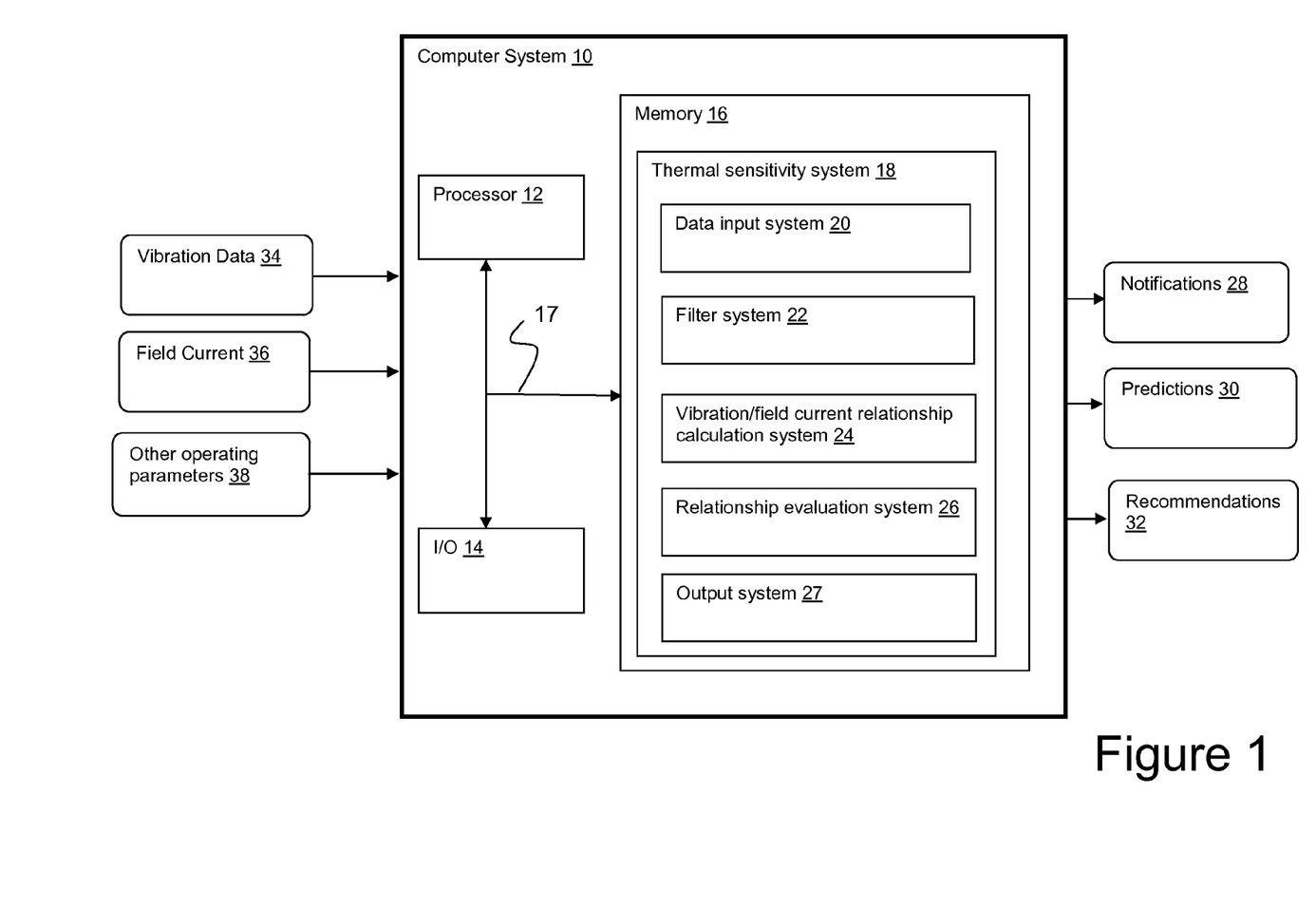
FIG. 1 is a schematic diagram of a computer system having a thermal sensitivity system according to one embodiment of the present invention.

FIG. 1 depicts an illustrative computer system 10 for implementing a thermal sensitivity system 18 that analyzes vibration data 34, field current 36 and other operating parameters 38 to evaluate thermal sensitivity in a rotor. Other operating parameters include, e.g., field voltage and temperature, armature voltage and current, lube oil temperatures, Megawatt (MW) load, Megavar (MVAR) load, hydrogen gas purity and pressure (if applicable), common cold gas temperature, bearing metal temperature, rotor speed, etc. These operating parameters are used to determine stable operating conditions, i.e., a unit may be considered stable if the variation in the parameters is within specified limits for a specified time.

Thermal sensitivity system 18 generally includes: a data input system 20 for obtaining input data; a filter system 22 for eliminating bad input and unstable data, e.g., based on unstable operating conditions or bad sensors; a vibration/field current relationship calculation system 24 for calculating a relationship between vibration levels and field current at stable operating conditions; and a relationship evaluation system 26 that evaluates the calculated relationship (e.g., as a discrete value or over a period of time); and an output system 27 that generates, for instance, notifications 28, predictions 30 of when anomolies associated with thermal sensitivity might become an issue, and recommendations 32 regarding operations to ensure threshold vibration levels are not exceeded.

Vibration data 34 may be collected in any manner, e.g., amplitude or phase or both overall vibration and synchronous vibration using sensors. In one illustrative embodiment, vibration data 34 may include X and Y components of vibration at the bearings of a rotor. As data is collected, filter system 22 may utilize statistical filters to address data quality issues, e.g., to identify obvious outliers and remove bad data.

As noted above, the vibration/field current relationship can be measured using any statistical method, including, e.g., rate of change in vibration with respect to field current, coefficient of determination between vibration and field current, etc. Thus for example, a slope value M may be calculated as the rate of change in vibration with respect to field current. In another embodiment, the slope value M may be calculated over a period of time to provide a series of slope values $M_1$, $M_2$, $M_3$, . . . .

Once the relationship is established, relationship evaluation system 26 determines whether or not a thermal sensitivity exists and what action should be taken. For instance, assuming slope is used as the calculated relationship, if the calculated slope value M is greater than a predetermined threshold slope $M_T$, then it may be concluded that a significant relationship exists between field current and vibration. In this case, a notification 28 indicating a thermal sensitivity problem can be issued by output system 27. Historical data may be utilized to establish the predetermined threshold slope $M_T$.

In another illustrative embodiment in which the relationship is calculated as slope, a series of slope values $M_1$, $M_2$, $M_3$, . . . can be evaluated to determine if a significant change in the relationship occurs over a period of time. Based on how significant the changes are, a notification 28 can be issued by output system 27 that thermal sensitivity exists. In addition, a prediction 30 can made as to when the effects (i.e., vibration) associated with thermal sensitivity is likely to cause a failure or reach some critical threshold.

For example, assume a first scenario in which the following slope values are calculated:
$M_1$=2.00
$M_2$=2.10
$M_3$=2.05
$M_4$=2.07
In this case, there is insignificant deviation between the slope values over time, so no thermal sensitivity appears to exist. Assume a second scenario:
$M_1$=2.00
$M_2$=2.50
$M_3$=3.55
$M_4$=5.00
In this case, not only are the slope values trending higher with each calculation, but the changes between slope calculations are becoming greater and greater. Based on some predetermined statistical criteria, this may indicate that a thermal sensitivity exists and a notification 28 should be issued, and that a prediction 30 should be issued of when to expect a thermal sensitivity related problem and/or failure. The amount and type of change in the relationship that indicates a thermal sensitivity problem can likewise be ascertained from historical data.

Figure 6:
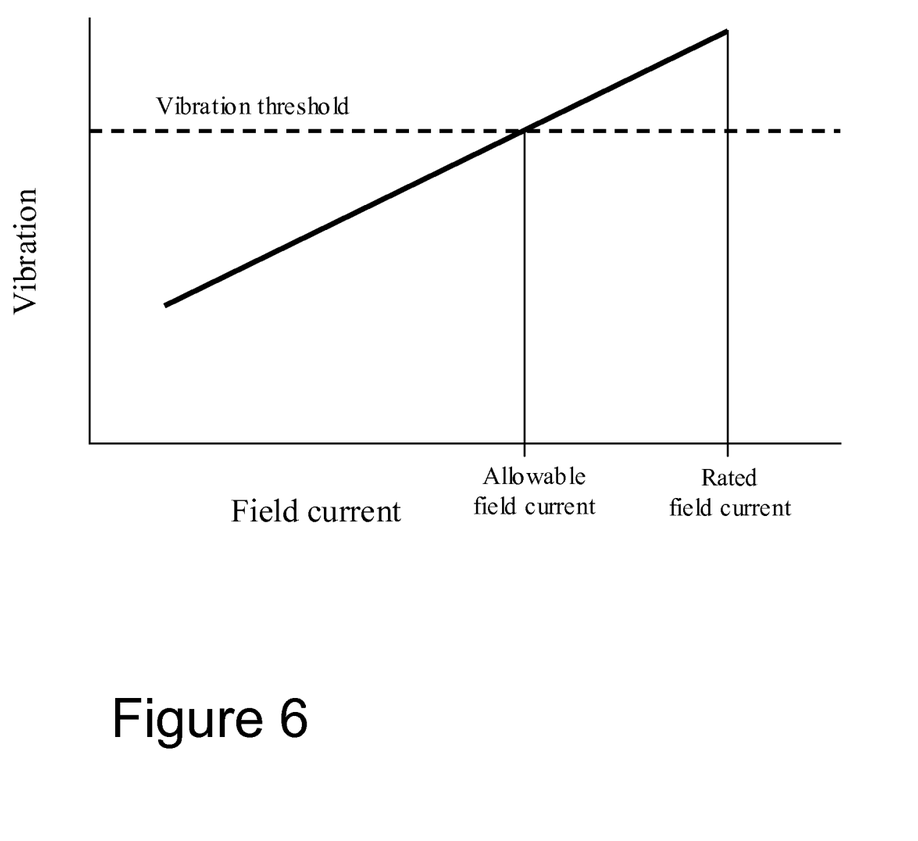
FIG. 6 is a graph showing a relationship between field current and vibration according to one embodiment of the present invention.

In a further embodiment, a recommendation 32 can be issued by output system regarding how to operate the machine (i.e., by limiting operation to a maximum field current) if the thermal sensitivity and/or vibration level is approaching a critical threshold. For example, as shown in FIG. 6, assume a linear relationship between vibration and field current. The machine is designed to operate at maximum rated field current but in case of thermal sensitivity, vibration varies as a function of field current. In order to avoid trip or forced outage due to high vibration, the operating field current should be limited to ensure vibration is less than vibration threshold.

Figure 2:
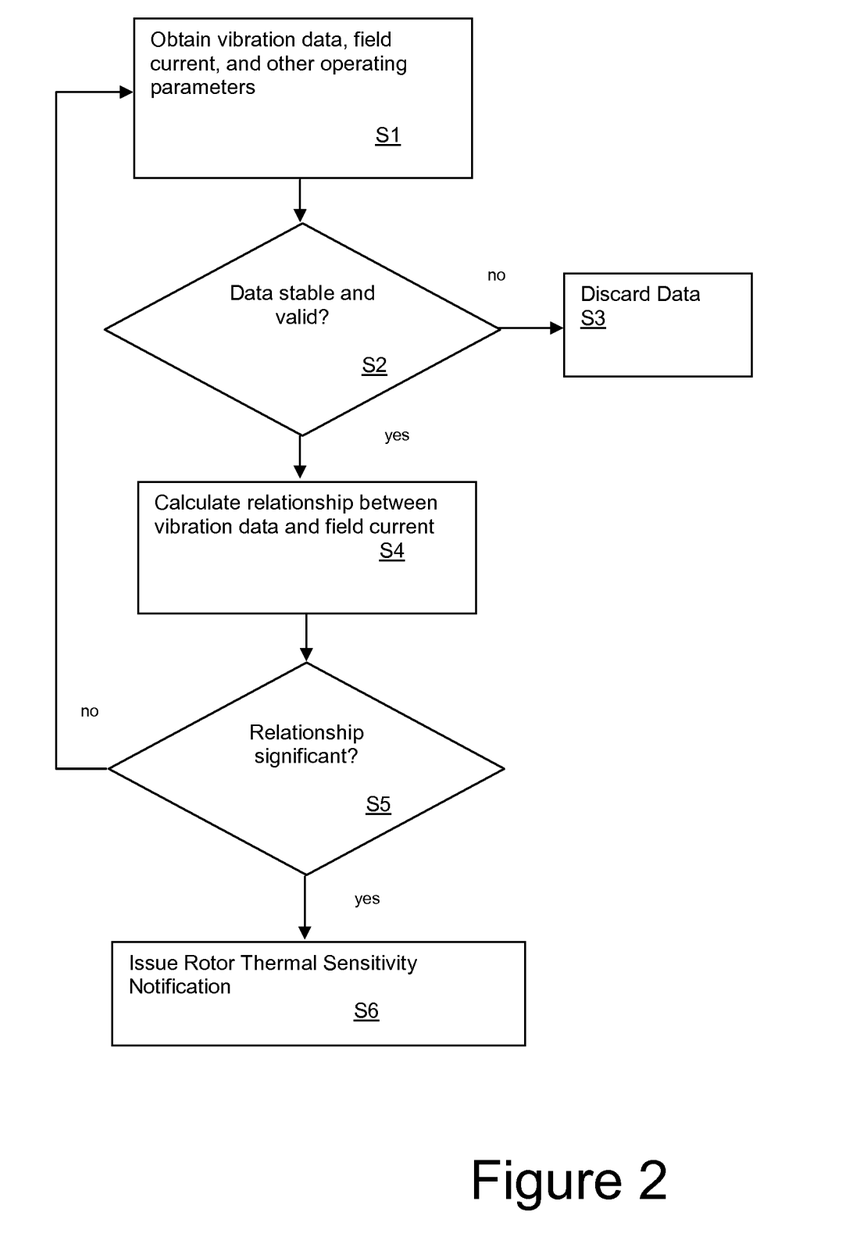
FIG. 2 is a flow diagram according to one embodiment of the present invention.

FIG. 2 depicts a flow diagram of a first illustrative process. At S1, data input system 20 obtains vibration data, field current from the rotor sensors and other operating parameters such as field voltage and temperature, armature voltage and current, lube oil temperatures, MW load, MVAR load, hydrogen gas purity and pressure (if applicable), common cold gas temperature, bearing metal temperature, rotor speed, etc., from, e.g., any known sensor associated with the operating parameter. At S2, filter system 22 makes a determination whether the data is valid and collected during stable operating conditions, and if not, the data is discarded at S3. At S4, vibration/filed current relationship calculation system 24 calculates a relationship between vibration data and field current. As noted, any technique can be used for this calculation, e.g., a regression model between vibration (response) and field current (regressor), a transfer function, a slope, etc. Once calculated, a determination is made whether the relationship is significant at S5, e.g., is a calculated relationship value greater than a predetermined threshold (for instance, is the slope greater than 4). If yes, then thermal sensitivity is indicated and at S6 a rotor thermal sensitivity notification is issued by output system 27. If no, the process loops back to S1.

Figure 3:
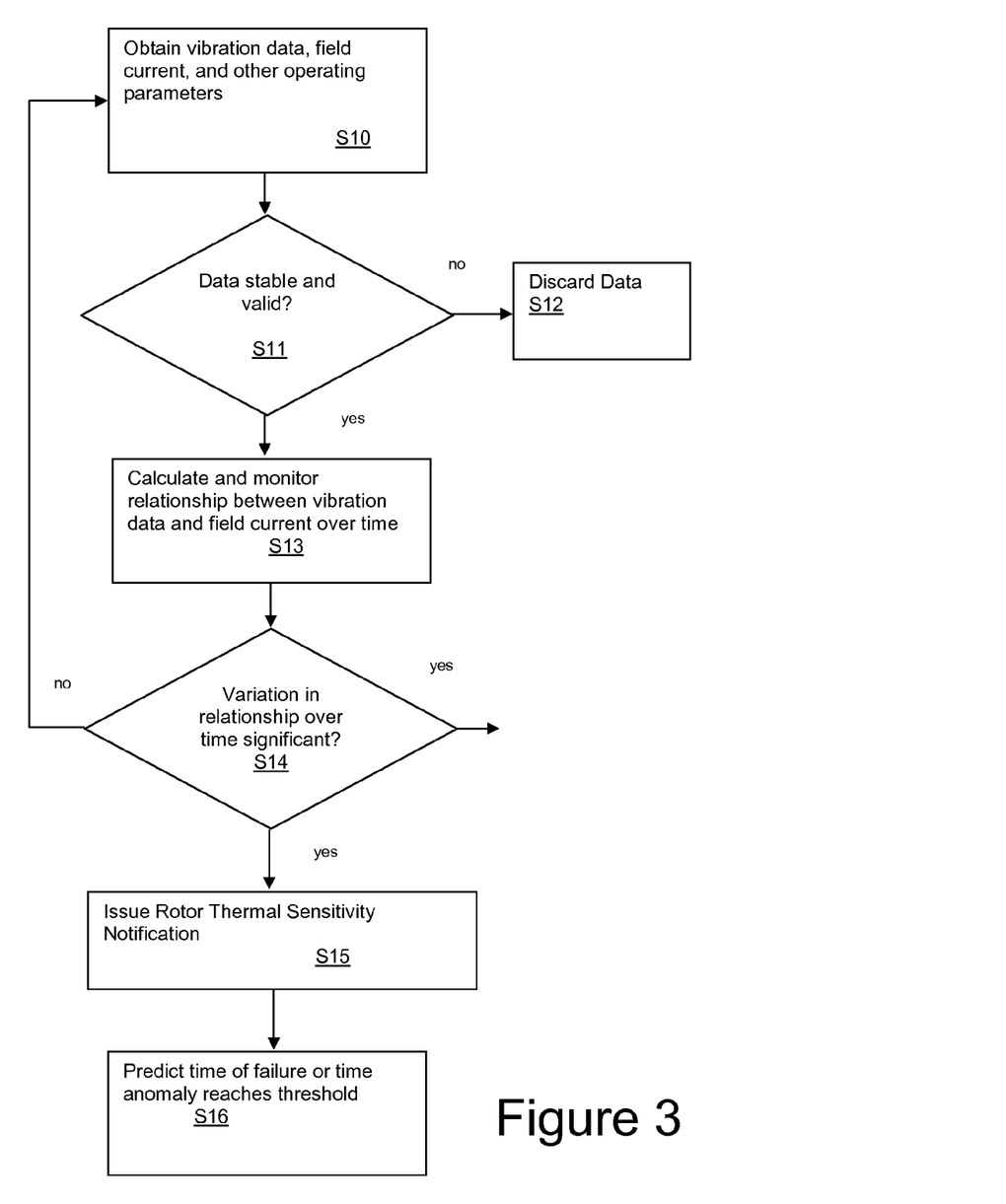
FIG. 3 is a flow diagram according to a second embodiment of the present invention.

FIG. 3 depicts a flow diagram of a second illustrative process. At S10, vibration data, field current from the rotor sensors and other operating parameters such as field voltage and temperature, armature voltage and current, lube oil temperatures, MW load, MVAR load, hydrogen gas purity and pressure (if applicable), common cold gas temperature, bearing metal temperature, rotor speed, etc., are obtained from data input system 20 using any known sensor associated with the corresponding operating parameter. At S11, a determination is made whether the data is valid and stable by filter system 22, and if not, the data is discarded at S12. At S13, vibration/filed current relationship calculation system 24 monitors and calculates a relationship between vibration data and field current at a series of points over a period of time. Once calculated, a determination is made whether a change in the series of calculated relationships over the period of time is significant at S14. As discussed, statistically significant changes in the relationship between vibration and field current over a period of time (e.g., a changing slope) indicates thermal sensitivity, which will trigger a notification at S15 if the change exceeds a predetermined threshold. If not, the process loops back to S10. In the event that thermal sensitivity is indicated, monitoring the rate of change in the relationship between vibration and field current over a period can also be used by relationship evaluation system 26 to predict the time to failure of a unit or for the vibration to reach the predetermined threshold, S16. Any number of statistical methods can be utilized to monitor the variation in relationship between vibration and field current over a period of time and predict the time of failure or for the anomaly to reach the threshold.

Figure 4:
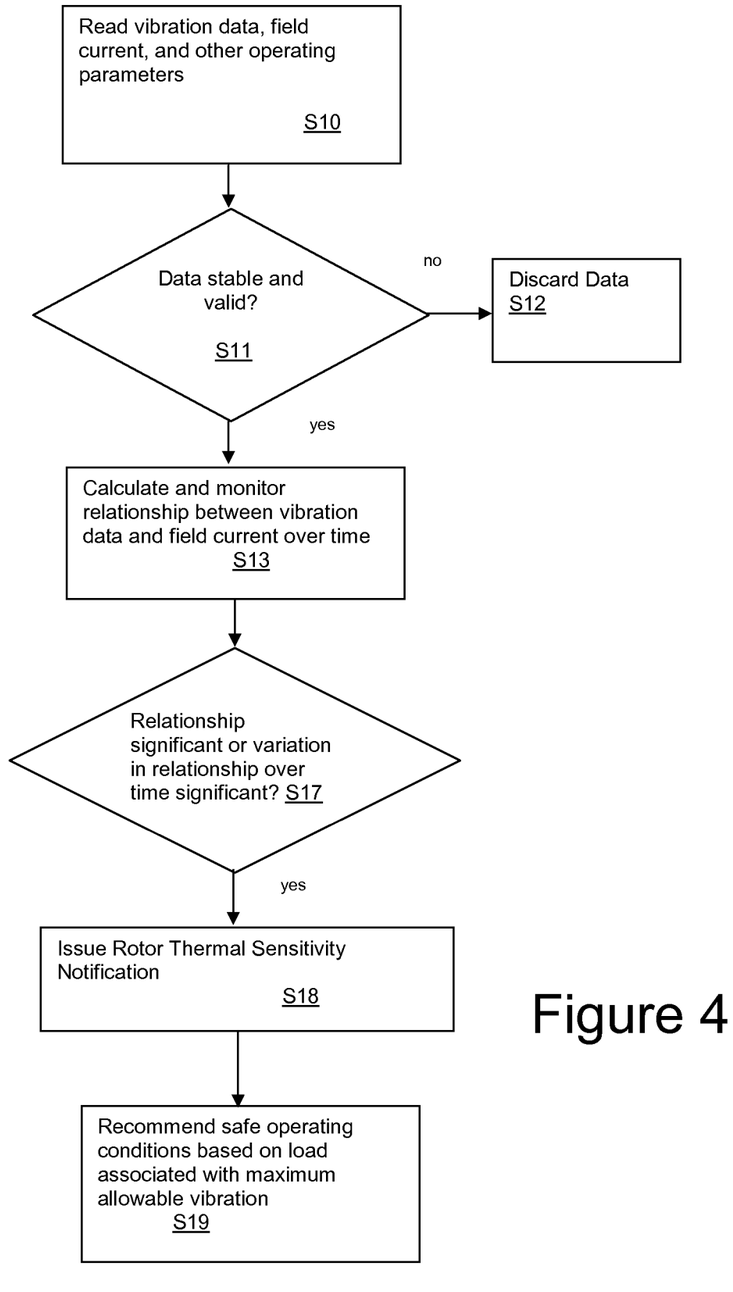
FIG. 4 is a flow diagram according to a third embodiment of the present invention.

FIG. 4 depicts a flow diagram of a third embodiment. In this case, processes S10-S13 are identical to the embodiment shown in FIG. 3. However, in this embodiment, an inquiry at S17 is made whether there is a significant relationship or significant variation in relationship over time. If yes, then a rotor thermal sensitivity notification is issued at S18 and at S19 safe operating conditions are recommended by output system 27 based on the load associated with the maximum allowable vibration. If no, the process loops back to S10. If the rotor is thermally sensitive and the vibration level is approaching a critical threshold, monitoring the field current corresponding to maximum vibration helps in operating the generator within safe operating conditions by limiting the operating field current, thus avoiding a forced outage or trip due to high vibration.

Figure 5:
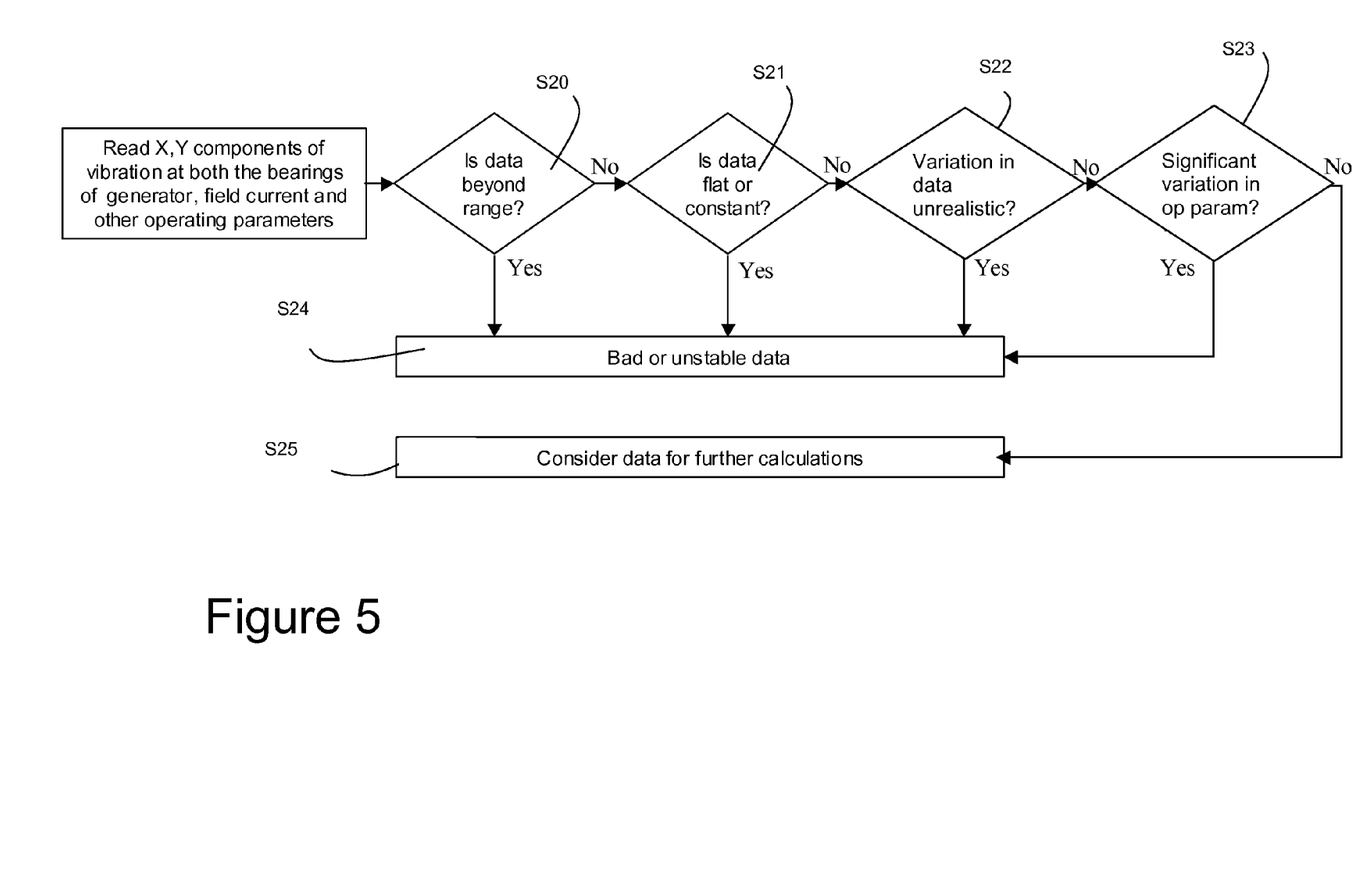
FIG. 5 is a flow diagram for filtering data according to one embodiment of the present invention.

FIG. 5 depicts a flow chart for an illustrative process for filtering bad data. At S20, S21, S22, and S23, determinations are respectively made whether the data is beyond an expected range, the data is flat, the data is unrealistic, or significant variation in operating parameters exists. If any of these inquiries are yes, the data is indicated as bad or unstable at S24, otherwise the data is available for further calculations at S25.

In various embodiments of the present invention, aspects of the systems and methods described herein can be implemented in the form of an entirely hardware embodiment, an entirely software embodiment or an embodiment containing both hardware and software elements. In one embodiment, the processing functions may be implemented in software, which includes but is not limited to firmware, resident software, microcode, etc.

Furthermore, the processing functions can take the form of a computer program product accessible from a computer-usable or computer-readable medium providing program code for use by or in connection with a computer or any instruction execution system (e.g., processing units). For the purposes of this description, a computer-usable or computer readable medium can be any computer readable storage medium that can contain or store the program for use by or in connection with the computer, instruction execution system, apparatus. Additional embodiments may be embodied on a computer readable transmission medium (or propagation medium) that can communicate, propagate or transport the program for use by or in connection with the computer, instruction execution system, apparatus, or device.

The computer readable medium can be an electronic, magnetic, optical, electromagnetic, infrared, or semiconductor system (or apparatus or device). Examples of a computer-readable medium include a semiconductor or solid state memory, a random access memory (RAM), a read-only memory (ROM), a rigid magnetic disk and an optical disk. Current examples of optical disks include a compact disk— read only memory (CD-ROM), a compact disk—read/write (CD-R/W) and a digital video disc (DVD).

FIG. 1 depicts an illustrative computer system 10 having a processor 12, I/O 14, memory 16 and bus 17. Thermal sensitivity system 18 may be stored in memory 16, e.g., as program code that is executable by processor 12. Computer system 10 can comprise one or more general purpose computing articles of manufacture (e.g., computing devices) capable of executing program code installed thereon. As used herein, it is understood that "program code" means any collection of instructions, in any language, code or notation, that cause a computing device having an information processing capability to perform a particular function either directly or after any combination of the following: (a) conversion to another language, code or notation; (b) reproduction in a different material form; and/or (c) decompression. To this extent, diagnosis system 18 can be embodied as any combination of system software and/or application software. In any event, the technical effect of computer system 10 is to the ability to identify rotor thermal sensitivity online.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

While the disclosure has been particularly shown and described in conjunction with a preferred embodiment thereof, it will be appreciated that variations and modifications will occur to those skilled in the art. Therefore, it is to be understood that the appended claims are intended to cover all such modifications and changes as fall within the true spirit of the disclosure.

What is claimed is:

1. A system for evaluating thermal sensitivity in a rotor of an electrical machine, comprising:
   an input system for obtaining vibration data and field current from the rotor, and for obtaining a set of operating parameters;
   a system for calculating a relationship between vibration and field current at stable operating conditions, wherein the stable operating conditions are based on the set of operating parameters;
   an evaluation system for determining whether the relationship is significant; and
   an output system for issuing a notification of thermal sensitivity in response to a determination of a significant relationship.

2. The system of claim 1, wherein the set of operating parameters are selected from a group consisting of: field voltage and temperature, armature voltage and current, lube oil temperatures, Megawatt load, Megavar load, hydrogen gas purity and pressure, common cold gas temperature, bearing metal temperature, and rotor speed.

3. The system of claim 1, wherein the relationship is calculated as one of: a rate of change, a coefficient of determination, a correlation coefficient, a transfer function and a regression model.

4. The system of claim 1, further comprising a filter system for filtering bad input and unstable data.

5. The system of claim 1, wherein the evaluation system compares a calculated relationship to a predetermined threshold.

6. A system for evaluating thermal sensitivity in a rotor of an electrical machine, comprising:
   an input system for obtaining vibration data and field current from the rotor and for obtaining a set of operating parameters;
   a system for calculating a series of relationships between vibration and field current over a period of time at stable operating conditions, wherein the stable operating conditions are determined based on the set of operating parameters;
   an evaluation system for determining whether a change in the series of relationships over the period of time is significant; and
   an output system for issuing a notification of thermal sensitivity in response to a determination of a significant change in the series of relationships.

7. The system of claim 6, wherein the set of operating parameters are selected from a group consisting of: field voltage and temperature, armature voltage and current, lube oil temperatures, Megawatt load, Megavar load, hydrogen gas purity and pressure, common cold gas temperature, bearing metal temperature, and rotor speed.

8. The system of claim 6, wherein each of the series of relationships are calculated as one of: a rate of change, a coefficient of determination, a correlation coefficient, a transfer function and a regression model.

9. The system of claim 6, further comprising a filter system for filtering bad input and unstable data.

10. The system of claim 6, wherein the output system further issues a prediction of a time of a failure or a vibration anomaly reaching a threshold based on the series of relationships.

11. The system of claim 6, wherein the output system further issues a recommendation of a safe operating level based on a field current associated with a maximum vibration level.

12. A computer program comprising program code embodied in at least one computer-readable storage medium, which when executed, enables a computer system to provide a method of evaluating thermal sensitivity in a rotor of an electrical machine, the method comprising:

obtaining vibration data and field current from the rotor, and for obtaining a set of operating parameters;

calculating a relationship between vibration and field current at stable operating conditions, wherein the stable operating conditions are based on the set of operating parameters;

determining whether the relationship is significant; and issuing a notification of thermal sensitivity in response to a determination of a significant relationship.

13. The computer program of claim 12, wherein the set of operating parameters are selected from a group consisting of: field voltage and temperature, armature voltage and current, lube oil temperatures, Megawatt load, Megavar load, hydrogen gas purity and pressure, common cold gas temperature, bearing metal temperature, and rotor speed.

14. The computer program of claim 12, wherein the relationship is calculated as one of: a rate of change, a coefficient of determination, a correlation coefficient, a transfer function and a regression model.

15. The computer program of claim 12, further comprising filtering bad input and unstable data.

16. The computer program of claim 12, wherein the determining compares a calculated relationship to a predetermined threshold.

* * * * *